United States Patent [19]

Mizutani

[11] Patent Number: 4,665,418
[45] Date of Patent: May 12, 1987

[54] SEMICONDUCTOR MEMORY DEVICE

[75] Inventor: Yoshihisa Mizutani, Tokyo, Japan

[73] Assignee: Tokyo Shibaura Denki Kabushiki Kaisha, Kawasaki, Japan

[21] Appl. No.: 563,101

[22] Filed: Dec. 16, 1983

[30] Foreign Application Priority Data

Jan. 10, 1983 [JP] Japan .................................. 58-1921

[51] Int. Cl.[4] ...................... H01L 29/78; G11C 11/34
[52] U.S. Cl. .................................... 357/23.5; 365/185
[58] Field of Search ...................... 357/23.5, 23.8, 13, 357/53, 41, 54, 15; 365/184, 185

[56] References Cited

U.S. PATENT DOCUMENTS

| 4,070,687 | 1/1978 | Ho | 357/23.8 |
|---|---|---|---|
| 4,258,378 | 3/1981 | Wall | 357/23.5 |

FOREIGN PATENT DOCUMENTS

| 52-28277 | 3/1977 | Japan | 357/23.5 |
|---|---|---|---|
| 54-124688 | 9/1979 | Japan | 357/13 U |
| 56-104473 | 8/1981 | Japan . | |
| 57-01258 | 1/1982 | Japan | 357/23.8 |
| 58-140165 | 8/1983 | Japan | 357/23.8 |
| 1225227 | 3/1971 | United Kingdom . | |

OTHER PUBLICATIONS

IBM Technical Disclosure Bulletin, vol. 16, #2, p. 690, by James, Jul. 1973.
Patent Abstracts of Japan, 17.11.1981, vol. 5, No. 179, Abstract 56-104473.
Wada, "Charge Storage Characteristics of MIS-FETs with Floating Gate," Electronics and Communications in Japan, vol. 59-C, No. 8, pp. 101-109, 1976.
Gaind, "High-Performance FET Device Structure and Method," IBM Technical Disclosure Bulletin, vol. 15, No. 4, pp. 1342-1342a, Sep. 1971.

Primary Examiner—Andrew J. James
Assistant Examiner—Mark Prenty
Attorney, Agent, or Firm—Finnegan, Henderson, Farabow, Garrett & Dunner

[57] ABSTRACT

A semiconductor memory device includes n[+]-type first and second semiconductor regions which are separately formed in the surface area of a p-type semiconductor substrate, a floating gate and a control gate. The second semiconductor region acting as a drain in a data readout mode is composed of a main portion, and an additional portion having an impurity concentration lower than that of the main portion and formed in contact with the main portion and a channel region.

10 Claims, 11 Drawing Figures

F I G. 2
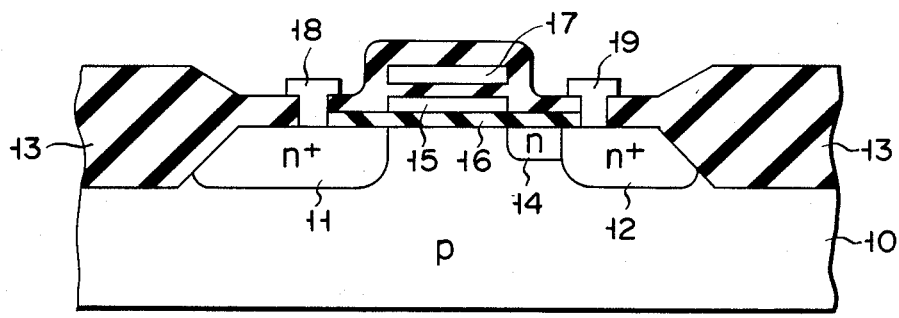
F I G. 3
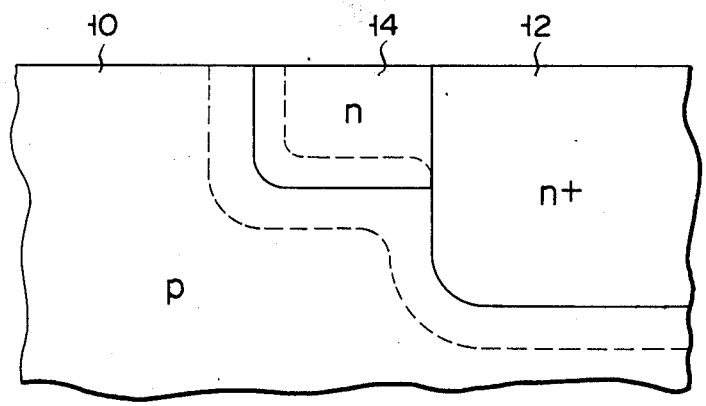

SEMICONDUCTOR MEMORY DEVICE

BACKGROUND OF THE INVENTION

The present invention relates to a semiconductor memory device which is provided with a floating gate and a control gate and can rewrite data.

FIG. 1 schematically illustrates a configuration which is one example of a memory cell used in a conventional erasable-programmable read only memory (EPROM). This memory cell is of the n-channel type and includes a p-type substrate 1 of monocrystalline silicon; n+-type source and drain regions 2 and 3; a floating gate 4 formed on a channel region between the source and drain regions 2 and 3, through a gate insulating layer 5; a control gate 6; and source and drain electrodes 7 and 8.

In executing the data write operation of the memory device shown in FIG. 1, a high level voltage, e.g., a voltage not lower than +20 V, is applied to the control gate 6 and drain electrode 8. Thus, impact ionization or the avalanche phenomenon is caused near the drain region 3, due to the electrons flowing from the source region 2 toward the drain region 3, thereby causing a number of electron-hole pairs to be generated. Part of the electrons among these electron-hole pairs are implanted in the floating gate 4, through the gate insulating layer 5, and are trapped therein. In this way, when the electrons are trapped in the floating gate 4, the memory cell has a high threshold voltage; so that, even if the readout voltage is applied to the control gate 6, this memory cell will not be turned ON. In a case where the electrons are not trapped in the floating gate 4, the memory cell has a low threshold voltage, so that this memory cell will be turned ON in response to the readout voltage applied to the control gate 6.

The data which was once written can be erased by radiating ultraviolet rays toward the memory cell.

Recently, the development in the micro processing technology of semiconductor devices has been advanced and, in particular, the shortening of the channel length has been promoted to improve the switching speed. This trend has been fairly pronounced in the field of EPROMs, where the channel length of each memory cell has been increasingly shortened. However, this shortening of the channel length has a negative influence on the characteristics of the semiconductor device. For example, the electric field formed in the channel region due to the voltage applied between the source and drain regions becomes strong, in conjunction with the shortening of the channel length. Therefore, even in the case where a relatively low voltage, e.g. a voltage of about +5 V is applied to the drain region and control gate in the readout operation of the EPROM, the electrons flowing from the source region to the drain region are accelerated to a sufficiently high speed, so that they may have a high enough level of kinetic energy to cause impact ionization in the channel region near the drain region. Therefore, in the EPROM which is highly integrated and is composed of memory cells, each of which has a shortened channel length, the electrons are injected into and trapped in the floating gate of the memory cell having a low threshold voltage in the readout operation, causing the threshold voltage of this memory cell to be raised. Such an erroneous write operation can be prevented, by reducing the power source voltage. However, the reduction of this power voltage results in a reduction in the speed of data readout from the memory cell.

SUMMARY OF THE INVENTION

A primary object of the present invention is to provide a semiconductor memory device which operates at high speed and with a high degree of reliability.

This object is accomplished by a semiconductor memory device comprising: a semiconductor substrate of one conductivity type; first and second regions of an opposite conductivity type separately formed in the surface area of this semiconductor substrate; a floating gate insulatively formed on a channel region between the first and second regions; a control gate insulatively formed on the floating gate; potential setting means for setting the potentials of the first and second regions; and electric field reducing means for reducing the electric field to be formed in the channel region near one of the first and second regions.

In the present invention, since the electric field formed near one of the first and second regions acting as a drain in the readout mode is weakened, the occurrence of impact ionization near this region is prevented. Thus, the data cannot be erroneously written in the readout mode.

BRIEF DESCRIPTION OF THE DRAWINGS

FIG. 2 schematically illustrates a cross-sectional configuration of a memory cell according to one embodiment of the present invention;

FIG. 3 is a diagram showing a depletion layer to be formed between the substrate and semiconductor region acting as a drain in the memory cell shown in FIG. 2 in the data readout mode;

DETAILED DESCRIPTION OF THE PREFERRED EMBODIMENTS

Figure 1:
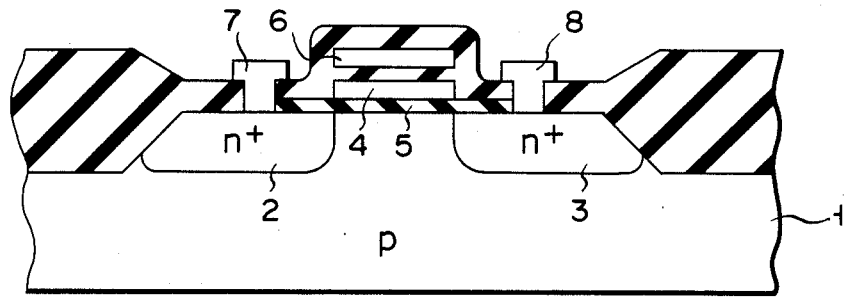
FIG. 1 schematically illustrates a cross-sectional configuration of a memory cell used in a conventional EPROM.

FIG. 2 schematically illustrates a cross-sectional configuration of a memory cell used to constitute an EPROM according to an embodiment of the present invention. This memory cell includes: two n+-type regions 11 and 12 having an impurity concentration of, e.g. $10^{19}$ to $10^{20}/cm^3$, and formed in the surface area of a p-type substrate 10 made of monocrystalline silicon; and a field insulating layer 13 which is so formed on the substrate 10 as to surround these n+-type regions 11 and 12. Furthermore, an n-type region 14 having an impurity concentration of, e.g. $10^{17}/cm^3$, which is lower than those of the n+-type regions 11 and 12, is formed in the surface area of the substrate 10, in contact with the end portion of the n+-type region 12 facing the n+-type region 11. That is, the channel region of this memory cell is formed between the n+-type region 11 and n-type region 14. A floating gate 15 made of polycrystalline silicon is formed on the channel region, through a thin insulating layer 16. In addition, a control gate 17 made of polycrystalline silicon is insulatively formed on this floating gate 15. Electrodes 18 and 19 are so formed as to be electrically connected to the n+-type regions 11 and 12.

When data is written into the memory cell shown in FIG. 2, the n+-type region 11 is used as a drain region, and n and n+-type regions 14 and 12 are used as a source region. Namely, a high voltage, e.g. a voltage of +5 V, is applied to the electrode 18 and control gate 17. In this case, the potential at that portion of the channel region which is near the n-type region 14 is substantially equal to that of the n-type region 14. Due to this fact, the electric field formed between the n- and n+-type regions 14 and 11 becomes strong in the local area of the channel region which is near the n+-type region 11, causing hot carriers or electron-hole pairs to occur in this local area, due to impact ionization, the electrons being injected into and trapped in the floating gate 15, through the insulating layer 16.

On the other hand, in reading out data from this memory cell, the n+-type region 11 is used as a source region, and the n and n+-type regions 14 and 12 are used as drain regions. Namely, the electrodes 18 and 19 are used as source and drain electrodes, respectively, and a voltage of, e.g. +5 V being applied across these electrodes 18 and 19 and a voltage of, e.g. +5 V is applied to the control gate 17. Thus, this memory cell is set into the OFF or ON state according to whether the electrons are trapped in the floating gate 15 or not, and output data corresponding to this OFF or ON state of the memory cell is obtained. In this case, since a depletion layer having a wider width is formed between the n-type region 14 and channel region, it is possible to remarkably weaken the electric field which concentrates at a portion of the channel region near the n-type region 14.

Figure 4A:
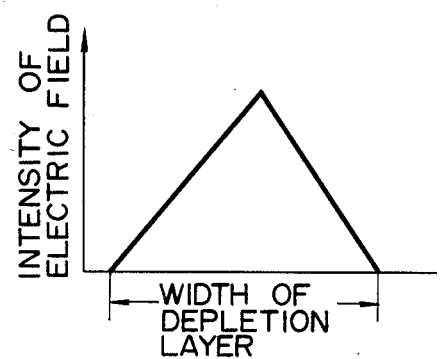
FIGS. 4A and 4B are diagrams showing the electric field distribution near the boundary between the substrate and semiconductor region acting as a drain in the memory cells shown in FIGS. 1 and 2 in the data readout mode.
Figure 4B:
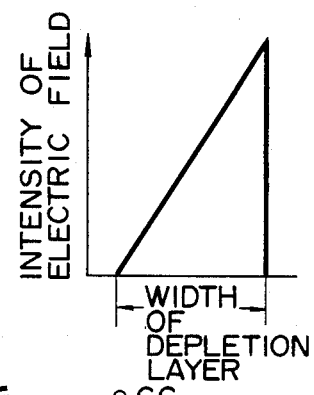

FIG. 3 shows a depletion layer which is formed near the boundary region between the p-type substrate 10 and the n and n+-type regions (14 and 12) acting as a drain in the data readout mode. As shown by the broken lines in FIG. 3, the depletion layer is formed not only in the channel region, but also in the n-type region 14 near the boundary between the n-type region 14 and channel region. Therefore, the electric field distribution in the depletion layer to be formed near the boundary between the n-type region and channel region is obtained as shown in FIG. 4A. On the other hand, in the memory device shown in FIG. 1, the depletion layer is formed only in the channel region and is not formed in the n+-type region 3. This is because the impurity concentration of the n+-type region 3 is higher and the depletion layer cannot extend into the n+-type region 3. Consequently, in this case, the electrical field distribution in the depletion layer having a narrow width, which layer is to be formed near the boundary between the n+-type region 3 and channel region, is steep; as shown in FIG. 4B.

In cases where the distances between the drain and source of the memory cells shown in FIGS. 1 and 2 are identical, and where the same voltages are applied across the drain and source, the peak value of the intensity of the electric field to be derived in the memory cell shown in FIG. 2 is smaller than in the case of the memory cell shown in FIG. 1. In other words, by forming an n-type region 14 having a lower impurity concentration as part of the drain region, it is possible to substantially weaken the electric field which concentrates at a portion of the channel region near the drain region. Hence, it is possible to suppress the occurrence of hot carriers, due to impact ionization in this portion, thereby enabling the erroneous writing of data to be prevented.

Figure 5:
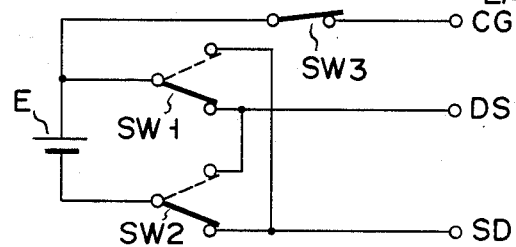
FIG. 5 is a circuit diagram of a power supply which can be used to make the memory cell shown in FIG. 2 operative.

In this way, in the memory cell shown in FIG. 2, there is no possibility of erroneous writing in the data readout operation, so that the channel length can be shortened, which allows the data write efficiency to be raised and enables a lower write voltage to be used, as compared to the conventional case. For example, it is possible to set both of the readout and write voltages at 5 V. In this case, as shown in FIG. 5, for example, it is possible to use a power supply circuit having a single power supply of 5 V. This power supply circuit comprises: a switch SW1 which is used to selectively connect the positive terminal of a power supply E to terminal DS or SD; a switch SW2 to selectively connect the negative terminal of the power supply E to terminal DS or SD; and a switch SW3 to connect the positive terminal of the power supply E terminal CG. Terminals DS and SD are connected to electrodes 18 and 19, respectively, through a transfer gate (not shown). The terminal CG is connected to the control gate 17. In the write mode, the switches SW1 and SW2 are set to the positions indicated by the solid lines in FIG. 5 by a control signal from a control circuit (not shown) and the switch SW3 is turned on. Thus, a voltage of 5 V is applied to the n+-type region 11 and control gate 17. On the other hand, in the readout mode, the switches SW1 and SW2 are set to the positions indicated by the broken lines in FIG. 5 and the switch SW3 is turned on. Thus, a voltage of 5 V is applied to the n and n+-type regions (14 and 12), as well as to control gate 17.

Figure 6:
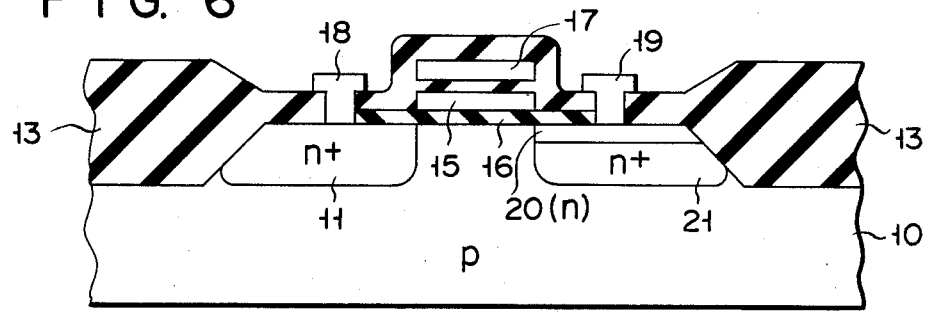
FIG. 6 schematically illustrates a cross-sectional configuration of a memory cell according to another embodiment of the present invention.

FIG. 6 schematically illustrates a cross-sectional configuration of a memory cell according to another embodiment of the present invention. This memory cell is constituted in a manner similar to that shown in FIG. 2, except that an n-type region 20 formed in the surface area of the p-type substrate 10 and an n+-type region 21 formed in the area under this n-type region 20 are used in place of the n and n+-type regions (14 and 12), viz. in the memory cell shown in FIG. 6, the region acting as a drain in the data readout mode is formed by the dual layer made of the n-type upper layer 20 and n+-type lower layer 21. Even in this memory cell, then n+-type regions 11, 21 are so formed as to have impurity concentrations of, e.g., from $10^{19}$ to $10^{20}/cm^3$, and the n-type region 20 is so formed as to have an impurity concentration of, e.g., $10^{17}/cm^3$, which is lower than those of the n+-type regions 11, 21.

Figure 7:
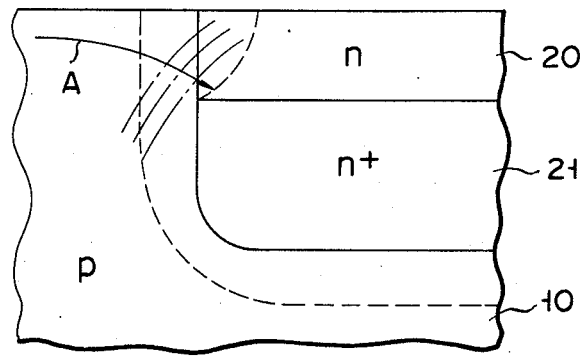
FIG. 7 is a diagram showing a depletion layer formed between the substrate and semiconductor region acting as a drain in the memory cell shown in FIG. 6 in the data readout mode.

In the case of writing data in this memory cell, the electrodes 18, 19 are used as drain and source electrodes, respectively, in the same manner as in the case of FIG. 2. While in case of reading out data from this memory cell, the electrodes 18 and 19 are used as source and drain electrodes, respectively. A control voltage is applied to the control gate 17 in the state such that a voltage of a proper level is applied across these electrodes 18 and 19. In this case, as indicated by the broken lines in FIG. 7, a depletion layer is formed in the n-type region 20 and channel region near the boundary of the n-type region 20 and p-type substrate 10. This allows the electric field near this n-type region 20 to be weakened in the same manner as in the case of FIG. 2. The dashed-and-dotted line in FIG. 7 represents the equipotential surface. This equipotential surface is inclined against the side surface of these n and n+-type regions 20 and 21, since the n+-type region 21 having a higher impurity concentration is formed on the lower side of the n-type region 20. The carriers from the source region 11 flow in a direction substantially perpendicular to the equipotential surface and flow downward, as indicated by an arrow A in FIG. 7, near the n and n+-type regions (20 and 21). Therefore, the impact ionization due to the flow of these carriers is caused in the deep portion of the p-type substrate 10.

As described above, in the memory cell shown in FIG. 6, the occurrence of hot carriers due to the impact ionization is suppressed and, furthermore, even if the hot carriers are generated due to impact ionization, these hot carriers are generated at a deep location within the substrate 10; therefore, almost all of the hot carriers will disappear before they reach the floating gate 15. Thus, the erroneous write can be securely prevented.

Figure 8:
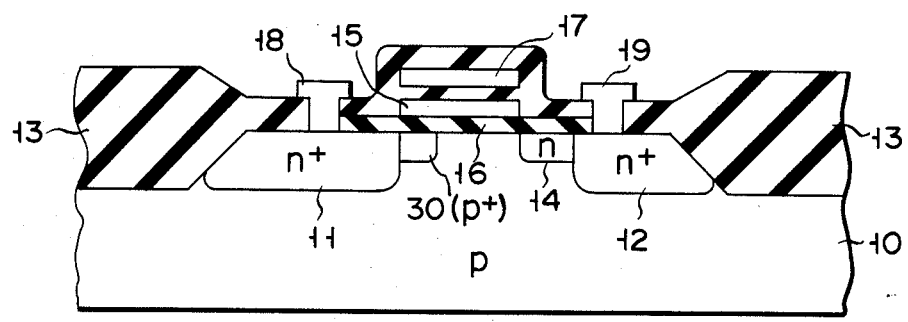
FIG. 8 shows a modification of the memory cell shown in FIG. 2.

FIG. 8 shows a modification of the semiconductor memory device shown in FIG. 2. This memory device is almost the same as that shown in FIG. 2, except that it further includes a p+-type region 30 which has an impurity concentration higher than that of the substrate 10 and is so formed in the surface area of the p-type substrate 10, in contact with part of the n+-type region 11, as to face the n-type region 14.

In writing data into this memory cell, the n+-type region 11 is used as a drain region, and the n and n+-type region (14 and 12) are used as a source region. In this case, the electric field to be generated between the drain and source regions due to the voltage applied between the electrodes 18 and 19 has a tendency to concentrate in the p+-type region 30, so that impact ionization will easily occur in this p+-type region 30; this permits the write efficiency to be raised. On the other hand, in reading out data from this memory cell, since the p+-type region 30 is formed in contact with the n+-type region 11 acting as a source region, the p+-type region 30 will hardly affect the readout operation.

Figure 9:
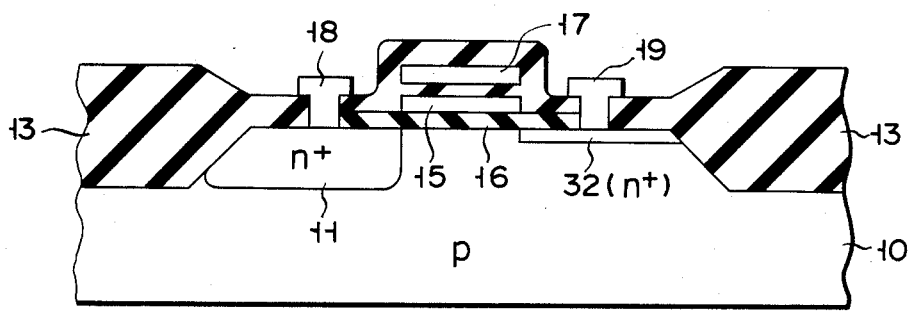
FIG. 9 schematically illustrates a cross-sectional configuration of a memory cell according to still another embodiment of the present invention.

FIG. 9 schematically illustrates a cross-sectional configuration of the memory cell as a still further embodiment according to the present invention. This memory cell is similar to that shown in FIG. 2, except that an n+-type region 32 is so formed as to be shallower than n+-type region 11, for example, at a depth of about 1/10 of n+-type region 11, in the surface area of the p-type substrate 10, and is formed in place of the n and n+-type regions (14 and 12). In the case where data is read out from this memory cell, a number of carriers will flow into the entire portion of the undersurface of the n+-type region 32 acting as a drain, viz. the electric field caused by the voltage applied between the electrodes 18, 19 will not locally concentrate on the side surface of the n+-type region 32; and, the carriers will also be distributed over the undersurface. Thus, the electric field near this n+-type region 32 will be weakened.

Therefore, even in this memory cell, the erroneous writing of data in the readout mode can be positively prevented.

Figure 10:
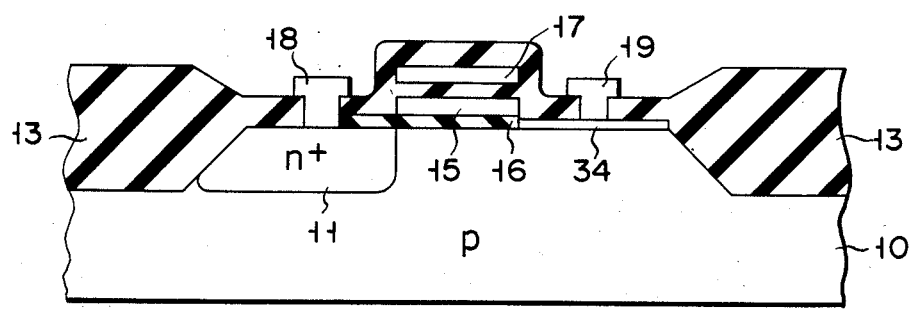
FIG. 10 shows a modification of the memory cell shown in FIG. 9.

FIG. 10 shows a modification of the memory cell shown in FIG. 9. This memory cell is constituted in a manner similar to that shown in FIG. 9, except that a conductive layer 34 made of metal or metal silicide is formed on the surface of the p-type substrate 10, in contact with the gate insulating layer 16 and in place of the n+-type region 32. In this memory cell, a Schottky junction is formed between the conductive layer 34 and p-type substrate 10, This Schottky junction serves as a source in the write mode and as a drain in the readout mode. Even in this memory cell, since the hot carriers flow throughout the entire portion of the interface between the conductive layer 34 and substrate 10 in the readout mode, the electric field to be caused by the voltage applied between the electrodes 18, 19 will not be substantially increased near the conductive layer 34.

Although the present invention has been described above with respect to several embodiments, it is not limited to these embodiments only. For example, in the above embodiment, although the n-channel MOS structure is used, a p-channel MOS transistor may also be used.

In addition, in the above-described embodiment, although that portion of the semiconductor substrate 10 which is in the device forming region has been so formed that it is higher than other portions, it is also possible to use a semiconductor substrate wherein this portion of the device forming region and other portions are substantially flat.

Furthermore, the p+-type region 30 shown in FIG. 8 may be also formed, even in the memory cell shown in FIG. 6, 9 or 10.

What is claimed is:

1. A semiconductor memory device comprising:
a semiconductor substrate of one conductivity type;
first and second semiconductor regions of an opposite conductivity type, which are separately formed in the surface area of said semiconductor substrate, said second semiconductor region having a main portion and an additional portion which has an impurity concentration lower than of said main portion and is formed in contact with the main portion and a channel region between said first and second semiconductor regions;
a floating gate insulatively formed on said channel region;
a control gate insulatively formed on said floating gate;
first and second power supply lines; and
switching means for selectively changing the electrical connections between said first and second power supply lines and said first and second semiconductor regions to selectively reverse the potentials of said first and second semiconductor regions.

2. A semiconductor memory device according to claim 1, further comprising a semiconductor region of said one conductivity type having an impurity concentration higher than that of said semiconductor substrate, and formed in the surface area of said semiconductor substrate and in contact with that part of said first semiconductor region which faces said second semiconductor region.

3. A semiconductor memory device according to

4. A semiconductor memory device according to claim 2, wherein said additional portion is formed in the surface area of said semiconductor substrate, and said main portion is formed in contact with the undersurface of said additional portion.

5. A semiconductor memory device according to claim 1, wherein said main portion is formed apart from said channel region, and at least part of said additional portion is formed between said main portion and said channel region.

6. A semiconductor memory device according to claim 1, wherein said additional portion is formed in the surface area of said semiconductor substrate, and said main portion is formed in contact with the undersurface of said additional portion.

7. A semiconductor memory device comprising:
a semiconductor substrate of one conductivity type;
first and second semiconductor regions of an opposite conductivity type, which are separately formed in the surface area of said semiconductor substrate, a channel region between said first and second semiconductor region, said second semiconductor region having a main portion and an additional portion which has an impurity concentration lower than that of said main portion and is formed in the surface area of said semiconductor substrate in contact with said channel region, and said main portion being formed in contact with the undersurface of said additional portion;
a floating gate insulatively formed on said channel region; and
a control gate insulatively formed on said floating gate.

8. A semiconductor memory device according to claim 7, further comprising a semiconductor region of said one conductivity type having an impurity concentration higher than that of said semiconductor substrate, and formed in the surface area of said semiconductor substrate and in contact with that part of said first semiconductor region which faces said second semiconductor region.

9. A semiconductor memory device comprising:
a semiconductor substrate of one conductivity type;
a first semiconductor region of an opposite conductivity type formed in the surface area of said semiconductor substrate;
a second semiconductor region of said opposite conductivity type formed shallower than and separated from said first semiconductor region on the surface area of said semiconductor substrate;
a floating gate insulatively formed on a channel region between said first and second semiconductor regions;
a control gate insulatively formed on said floating gate;
first and second power supply lines; and
switching means for selectively changing the electrical connections between said first and second power supply lines and said first and second semiconductor regions to selectively reverse the potentials of said first and second semiconductor regions.

10. A semiconductor memory device comprising:
a semiconductor substrate of one conductivity type;
a first semiconductor region of an opposite conductivity type formed in the surface area of said semiconductor substrate;
a conductive layer composed of a schotthy barrier metal formed apart from said first semiconductor region on the surface of said semiconductor substrate;
a floating gate insulatively formed on a channel region between said first semiconductor region and said conductive layer;
a control gate insulatively formed on said floating gate;
first and second power supply lines; and
switching means for selectively changing the electrical connections between said first and second power supply lines and said first semiconductor region and said Schottky barrier metal to selectively reverse the potentials of said first semiconductor region and said Schottky barrier metal.

* * * * *

UNITED STATES PATENT AND TRADEMARK OFFICE
CERTIFICATE OF CORRECTION

PATENT NO. : 4,665,418
DATED     : May 12, 1987
INVENTOR(S) : Yoshihisa Mizutani It is certified that error appears in the above-identified patent and that said Letters Patent is hereby corrected as shown below:

Please amend claim 3 by inserting the claim in its entirety as follows:

3. A semiconductor memory device according to claim 2, wherein said main portion is formed apart from said channel region, and at least part of said additional portion is formed between said main portion and said channel region.

Signed and Sealed this

Eighth Day of December, 1987

Attest:

DONALD J. QUIGG

*Attesting Officer*    Commissioner of Patents and Trademarks